United States Patent [19]

Howell

[11] Patent Number: 5,181,166
[45] Date of Patent: Jan. 19, 1993

[54] SECURING MECHANISM FOR AN ELECTRICITY METERING DEVICE

[75] Inventor: Chesley R. Howell, Scarborough, Canada

[73] Assignee: Schlumberger Canada Limited, Toronto, Canada

[21] Appl. No.: 708,754

[22] Filed: May 31, 1991

[51] Int. Cl.⁵ .............................................. H02B 9/00
[52] U.S. Cl. ..................................... 361/364; 24/279; 70/160; 70/232; 220/336; 292/307 R; 324/110; 361/369; 439/517
[58] Field of Search .................. 24/270, 279; 220/324, 220/336; 16/260; 361/331, 334, 356, 341, 364, 369, 371–373, 390; 439/133, 304, 517; 292/307 R, 256.67, 251; 324/110, 149, 156; 70/63, 77, 78, 160–166, 229–232

[56] References Cited

U.S. PATENT DOCUMENTS

| | | |
|---|---|---|
| 2,367,127 | 1/1945 | Johansson . |
| 2,530,899 | 11/1950 | Mueller . |
| 2,820,660 | 1/1958 | Ainsworth . |
| 2,902,308 | 9/1959 | Moberg . |
| 3,018,127 | 1/1962 | Dobrosielski et al. . |
| 3,250,559 | 5/1966 | Sommerfeld . |
| 3,479,104 | 11/1969 | Kobryner ........................... 312/229 |
| 3,572,795 | 3/1971 | Howard et al. . |
| 3,654,663 | 4/1972 | Algotsson ........................... 16/147 |
| 3,878,585 | 4/1975 | Morris ................................. 16/260 |
| 3,996,501 | 12/1976 | Tracey ................................ 439/133 |
| 4,106,801 | 7/1978 | De Lima Castro Neto . |
| 4,144,729 | 3/1979 | Nielsen, Jr. . |
| 4,286,813 | 9/1981 | Wylie . |
| 4,331,012 | 5/1982 | Swisher . |
| 4,414,829 | 11/1983 | Nielsen, Jr. et al. . |
| 4,415,190 | 11/1983 | Finck, Jr. et al. . |
| 4,416,478 | 11/1983 | Canney . |
| 4,477,861 | 10/1984 | Byrd, Jr. et al. . |
| 4,668,146 | 8/1987 | Newmark ........................... 361/364 |
| 4,704,881 | 11/1987 | Sloop, Jr. ............................ 70/158 |
| 4,805,946 | 2/1989 | Erwin et al. . |
| 4,823,572 | 4/1989 | Signorelli ............................ 70/166 |
| 4,827,568 | 5/1989 | Ramsauer ........................... 16/260 |
| 4,945,738 | 8/1990 | Blair et al. . |

Primary Examiner—Gerald P. Tolin
Attorney, Agent, or Firm—Sanford J. Asman

[57] ABSTRACT

A securing mechanism for an electricity metering device (30) including a housing (34) having a cavity, a cover (36) positioned on the housing (34) and enclosing said cavity, the cover (36) including hinge pins (120,122) for attaching the cover (36) to the corresponding hinge slots (80,82) on the housing (34) and a sealing screw (126) connected to the cover (36) for releasably securing the cover (36) to the housing (34). The sealing screw (126) is threaded through a hole (124) in the cover (36), and includes an opening (158), and the cover further includes a lug (162) defining a second opening (164) positioned for cooperation and registration with the first opening (158) when the sealing screw (126) has secured the cover (36) to the housing (34).

9 Claims, 6 Drawing Sheets

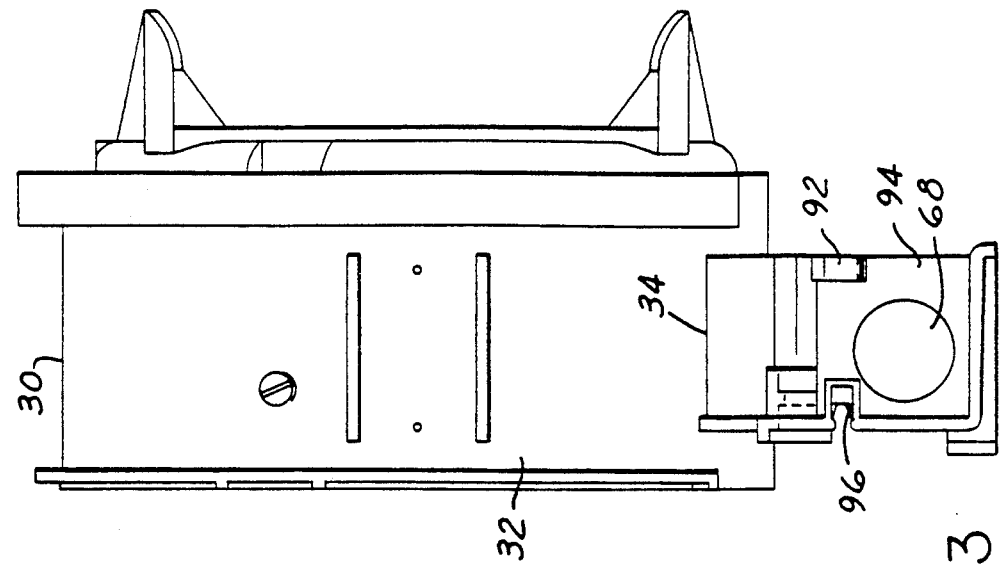
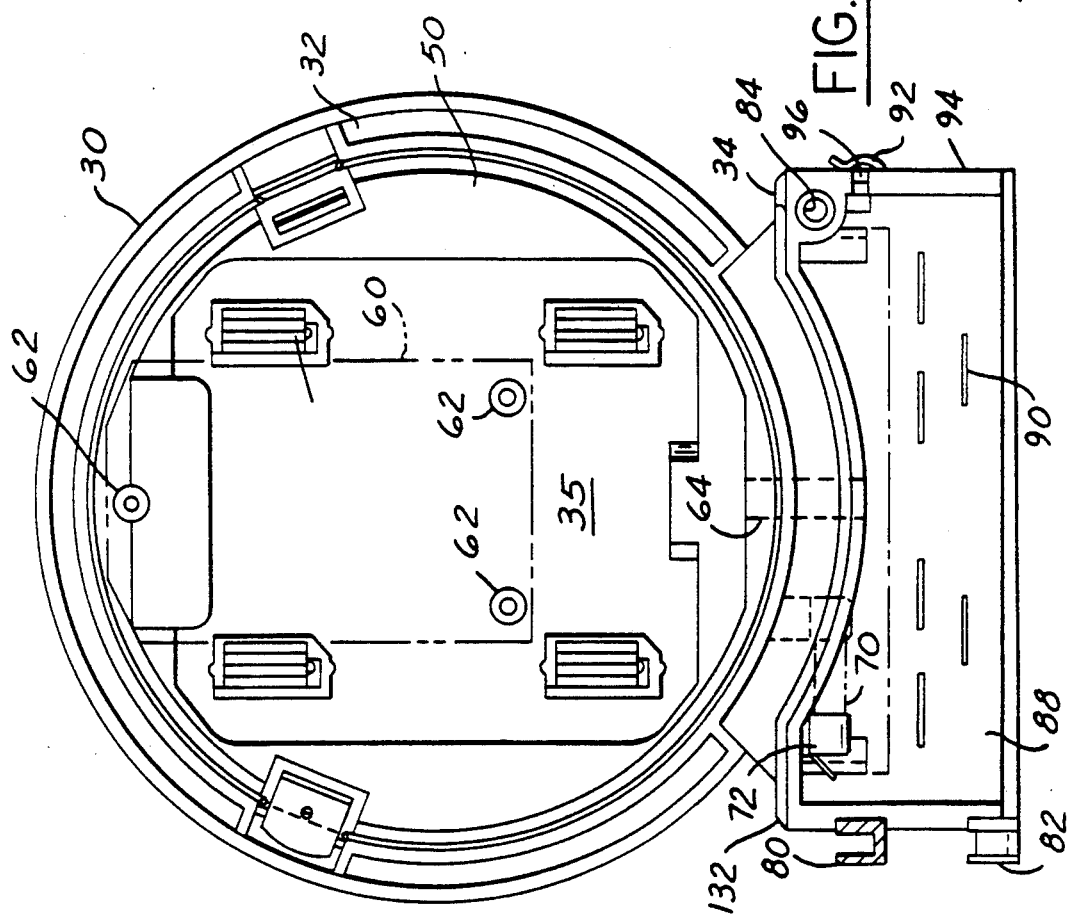
FIG.2
FIG.3

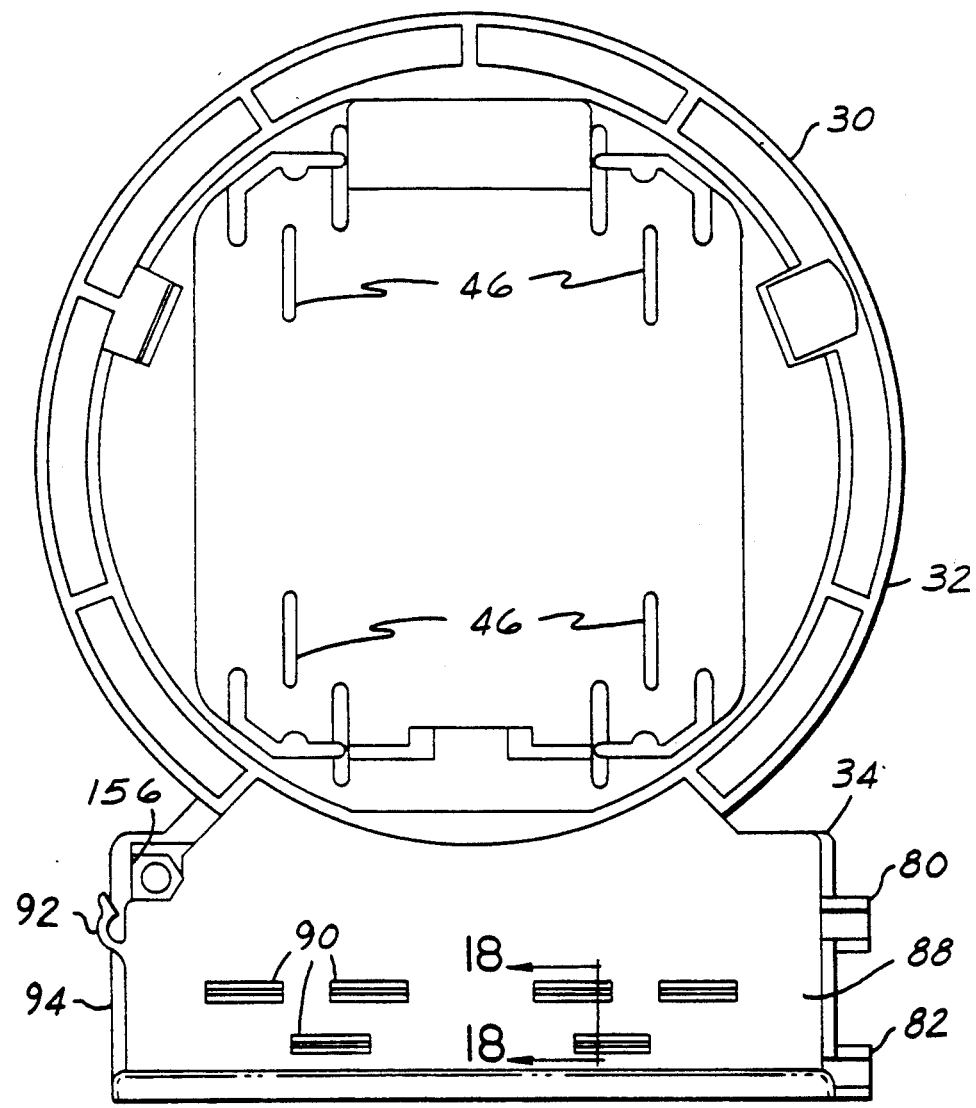
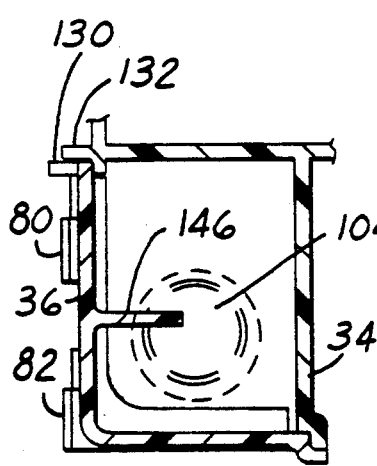
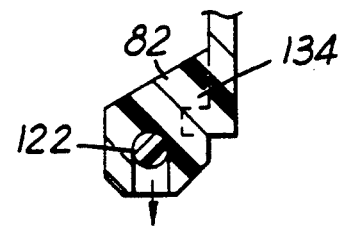
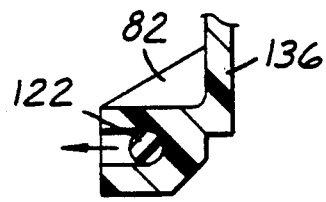
FIG. 4
FIG. 8   FIG. 9   FIG. 10

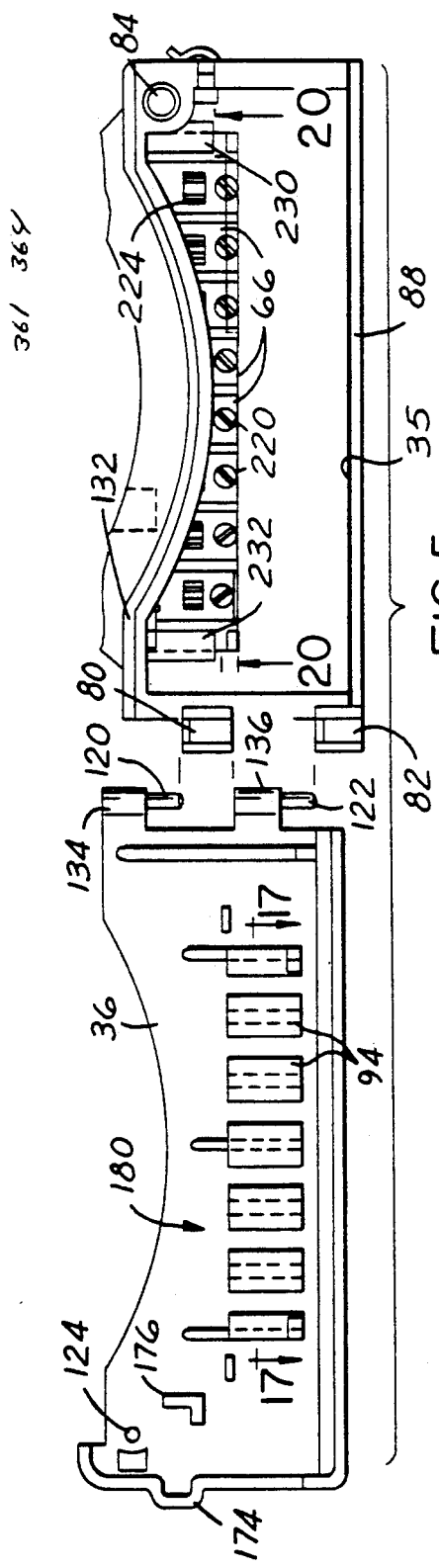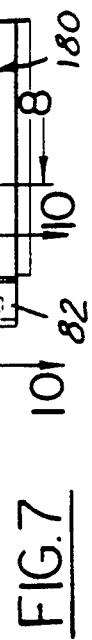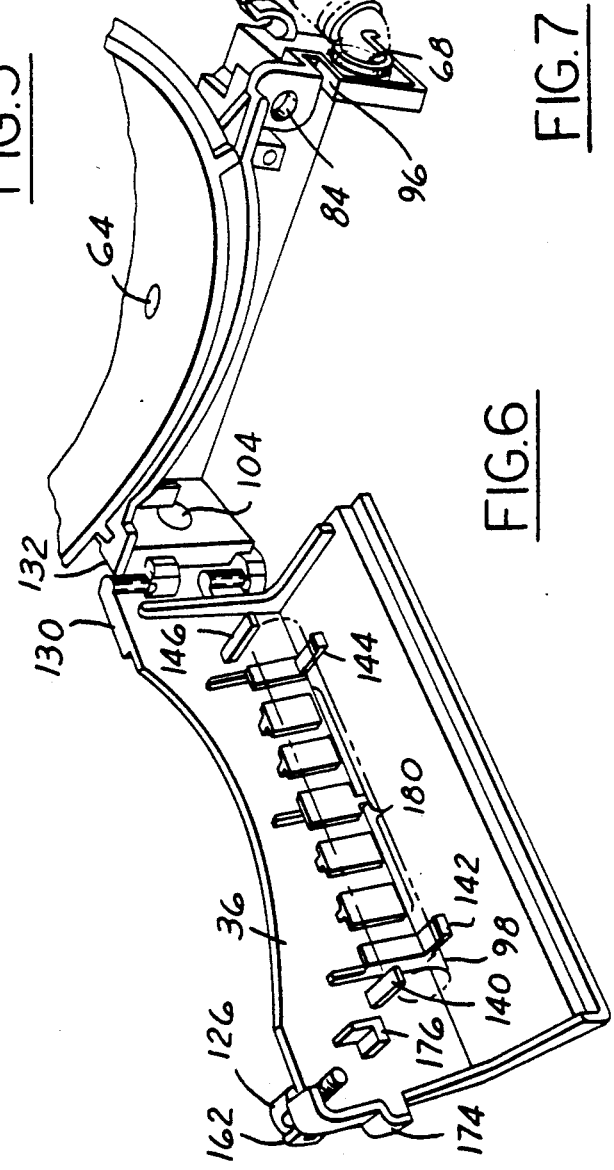

SECURING MECHANISM FOR AN ELECTRICITY METERING DEVICE

CROSS-REFERENCE TO RELATED APPLICATIONS

This application is being filed concurrently with the following applications which are commonly owned with the present application and relate to the same general subject matter:

Application entitled "Electricity Metering Device With Cover" U.S. Ser. No. 708,517.

Application entitled "Vent For Electricity Metering Device U.S. Ser. No. 708,517 and Application entitled "Cable Retaining Mechanism For Electricity Metering Device" U.S. Ser. No. 708,520.

The disclosure and subject matter of each of these applications is hereby incorporated by reference herein.

TECHNICAL FIELD

This invention relates generally to electricity metering devices, and more particularly to an interbase unit for an electricity meter including a tamper-proof and weather-resistant cover.

BACKGROUND ART

Meters are used in the utility industry to measure the amounts of electricity, gas, and the like that are being utilized by residential and commercial customers. Typically the meters are mounted on the exterior or interior walls of the residence or building and include a power box and rate metering device. The rate metering device is normally plugged in or otherwise affixed to the power box and has a clear cover or portion to allow viewing of the rate measuring mechanism and thus a determination of the amount of the utility consumed.

Recently, it has become advantageous and necessary to enhance or supplement the functions currently performed by existing meters. In particular, it has become advantageous and necessary in some cases to provide for remote reading of the meters and/or to provide for charging different rates for use of the utility during different periods of the day or depending on the temperature conditions. The reading of the rate meter from a remote location typically requires a connection of the meter to a telephone or dedicated power line. The charging of different rates depending on the time of the day or external temperature conditions typically requires the inclusion of additional circuitry and sensors in the meter.

When existing meters are modified to include one or more of these additional features, an interbase device can be utilized. The interbase is positioned in secure electrical contact between the primary meter and the power box. Sealing rings or other mechanisms are used to secure the elements together and prevent unauthorized separation and tampering.

Some known interbases include a circular base portion matching the shape of the metering device and power box opening. The circular bases have generally rectangular compartments thereon for placement of some of the sensors and electrical devices, and also to allow entry and exit of telephone and power cables. The compartments on these known interbase devices typically have a housing and removable cover and a series of air vents for circulation. These devices have required complete removal of the cover to gain access to the housing cavity, however, and also have air vents which are susceptible to tampering and entrance of moisture. Also, the sealing and fastening mechanisms were often inadequate or inconvenient to use, and the wire terminal strips were usually expensive and inconvenient to mount and utilize. Further, the inlet of the wires into the compartment typically required an expensive fitting and additional labor charges to install.

Mechanisms for hinging two elements together, such as a cover and base member are known. Known hinging mechanisms are shown, for example, in U.S. Pat. Nos. 132,053, 230,491, 3,295,713, 3,926,529, 4,036,494 and 4,930,753.

Vents and shaped passages for circulation of air or for cooling have been used in a number of devices. Air vents are shown, for example, in U.S. Pat. Nos. 329,591, 1,400,860, 1,899,018, 2,226,128, 3,167,688, 3,681,663, 4,118,755, 4,156,794, 4,180,955, 4,505,189, 4,665,466 and 4,919,227, as well as in some of the applicant's own prior commercial devices. Some of these are also relatively tamper resistant.

Sealing screws and sealing mechanisms for various devices including electrical meters are also well known, both in the patent literature and in prior commercial devices. Some of the patent art includes U.S. Pat. Nos. 2,367,127, 2,820,660, 3,018,127, 3,250,559, 3,572,795, 4,144,729, 4,286,813, 4,331,012, 4,414,829, 4,415,190, 4,416,478, 4,477,861 and 4,945,738.

Structures for allowing inlet of cables or wires into compartments or devices are further well known. These are shown, for example, in U.S. Pat. Nos. 3,299,201, 3,519,731, 3,809,798, 3,879,571 and 4,560,827.

SUMMARY OF THE INVENTION

One Object of the present invention is to provide an interbase unit including additional circuitry which would not otherwise fit in existing electricity metering devices, which interbase unit may be retrofitted to existing electricity metering devices, thereby obviating the need to replace those existing devices.

A second object of the present invention is to provide an interbase unit including metering and/or communications circuitry, such as secondary rate metering circuitry, and wire terminals and related components enclosed within a terminal housing which may be sealed on site in a manner which prevents tampering with the unit.

Another object of the present invention is to provide an interbase unit for an electricity metering device which includes a hinged cover and may be easily and quickly opened by authorized personnel for maintenance and service, and thereafter easily and quickly closed and sealed.

Still another object of the present invention is to provide an interbase unit for an electricity metering device which includes a cover which, once closed and sealed, is resistant to tampering.

It is another object of the present invention to provide an interbase unit for an electricity metering system which includes a cable trap for accommodating a cable entering the interbase in a secure and tamper-resistant fashion.

A further object of the present invention is to provide an electricity metering device including vents which are tamper-resistant and allow for ventilation between the components sealed within the device and the outside, and also allow the interior for the device to assume the temperature of the external atmosphere.

A still further object of the present invention is to provide an electricity metering device including one-piece terminal mounts upon which terminals may be quickly and easily mounted without the use of additional fasteners.

The electricity metering device of the present invention includes a generally cylindrical base from which a generally rectangular terminal housing extends, and a cover including means for securely fastening the cover over the top of the terminal housing to protect the enclosed terminals and components from tampering and weather. The terminal housing preferably includes one or more hinge slots located at one side thereof and means adapted to accommodate a sealing screw on the opposite side thereof. The cover includes one or more hinge pins adapted to be inserted into the hinge slots so that the cover can swing from an open position to a closed position over the open portion of the cavity in the terminal housing. The cover also includes a first barrier extending generally perpendicular from the outer surface of the cover on the top edge of the cover above the hinge pins, and the terminal housing generally includes a second barrier which extends outwardly above the hinge slot. The first barrier is adjacent and opposed to the second barrier when the cover is positioned in the hinged slots and rotated at an angle less than approximately 90 degrees from the back panel of the terminal housing, thereby preventing the cover from sliding relative to the terminal housing and securing the hinge pins in place in the hinge slots unless the cover is swung away from the terminal housing to an angle of greater than 90 degrees.

The cover also includes a hole of suitable diameter to accommodate a sealing screw positioned on the cover so that when the cover is closed, the sealing screw may be inserted through the hole in the cover and into a corresponding opening in the terminal housing thereby releasably securing the cover over the cavity in the terminal housing. The cover and screw also have corresponding openings therein so that when the cover is closed and secured, a seal can be positioned through the aligned openings and used to prevent tampering of the electricity metering device.

The terminal housing of the present invention also includes a cable trap or retention structure which allows electrical, telephone and other cables to be introduced into the cavity of the terminal housing without significant cost or effort, and without the use of additional fittings or connectors. The edge of one of the side walls of the terminal housing has a slot sufficient for positioning of a cable therein. The cover has a first retainer member which extends outwardly beyond the terminal housing adjacent the slot, and a second retainer member which is positioned to protrude into the terminal housing cavity adjacent the slot. The two retainer members, in combination with the slot, bend the cable into a U-shape as it enters the cavity thereby preventing removal and tampering.

The terminal housing further has air circulation means including air vents on one or more of the walls or surfaces of the housing cavity and air vents on the cover. Shield means are positioned inside the cavity adjacent the air vents (at least on the cover) to prevent tampering with or destruction of the components inside the housing cavity. The shield means preferably comprises an outwardly extending first wall portion and a second wall portion attached to the first wall portion and extending generally perpendicular to the cover or housing wall. The air vents are constructed with angled side wall surfaces and direct objects inserted through the openings toward the shield means.

A mount for the electric terminals is contained in the cavity of the terminal housing. The mount has outwardly extending retainer arms which allow the wire terminals to be snap-fitted thereon.

The electricity meter of the present invention is preferably an interbase unit wherein the top portion of the cylindrical base has a diameter suitable to receive the connecting base of a primary meter, and the bottom portion of the interbase is of a diameter suitable to fit into the circular opening at the power box. Thus, the interbase of the present invention may be utilized as an adjunct to existing electrical meters by disconnecting the existing electrical meter from the power box and installing the interbase between the primary electricity meter and the power box.

It will be appreciated by those skilled in the art that the interbase of the present invention may be utilized in a broad range of applications in addition to the secondary rate and remote communications functions specifically disclosed herein.

The above objects and other objects, features, and advantages of the present invention are readily apparent from the following detailed description of the best mode for carrying out the invention when taken in connection with the accompanying drawings.

BRIEF DESCRIPTION OF THE DRAWINGS

FIG. 2 is a front elevational view of the electricity metering device incorporating the present invention;

FIG. 3 is a side elevational view of the electricity metering device shown in FIG. 2;

FIG. 4 is a rear elevational view of the electricity metering device of FIG. 2;

FIG. 5 is a partial front view of the terminal housing of the present invention with the cover member disassembled therefrom;

FIG. 6 is a perspective view of the terminal housing with the cover member in an attached but open position;

FIG. 7 is a partial front view of the terminal housing with the cover member in the closed position;

FIG. 8 is a cross-sectional view taken in the direction of arrows 8—8 of the terminal housing shown in FIG. 7;

FIG. 9 is a partial cross-sectional view taken in the direction of arrows 9—9 of the hinge slot shown in FIG. 7;

FIG. 10 is a cross-sectional view taken in the direction of arrows 10—10 of the hinge slot shown in FIG. 7;

BEST MODE FOR CARRYING OUT THE INVENTION

Figure 1:
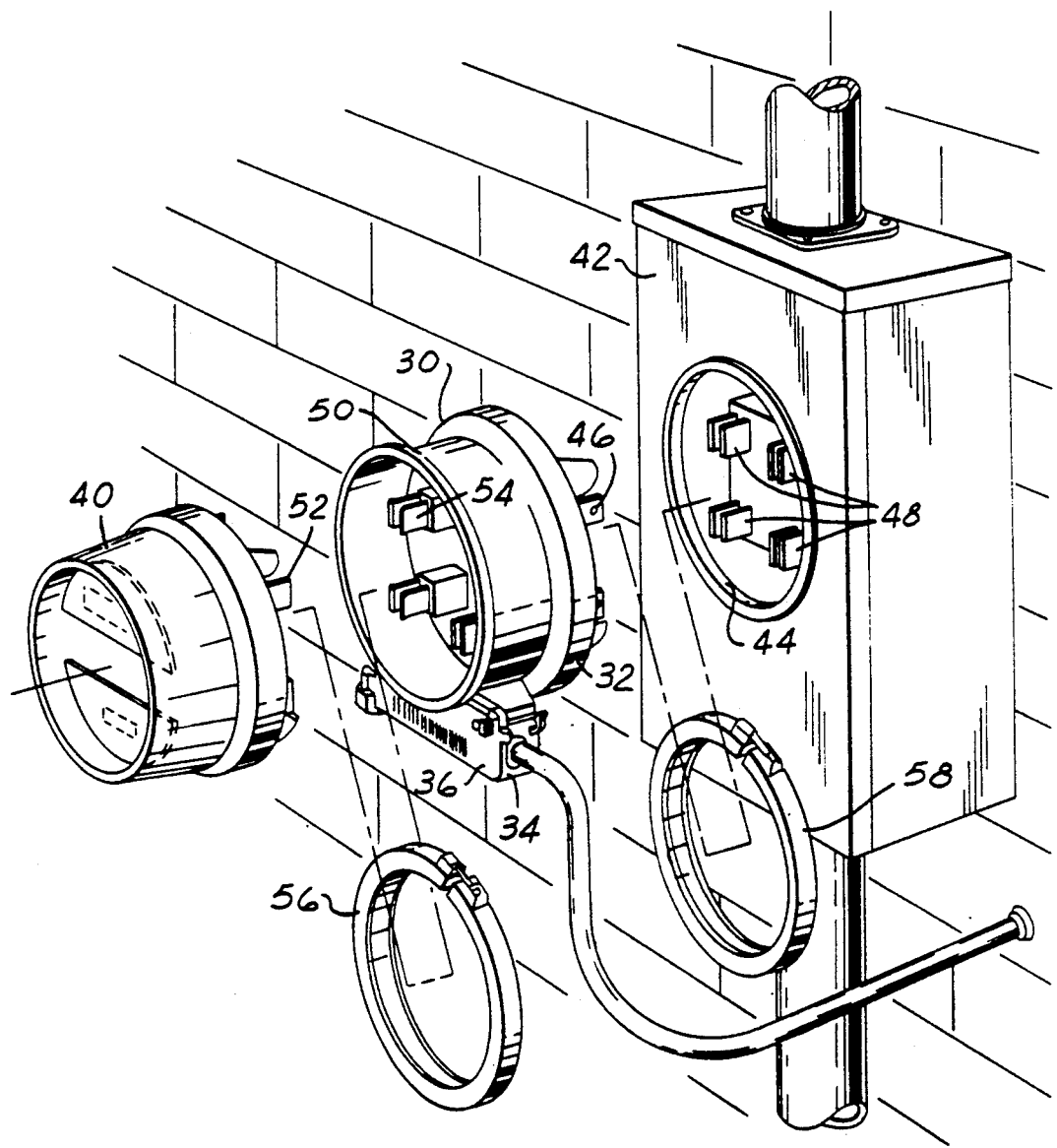
FIG. 1 is an exploded plan view of an electricity metering device illustrating the present invention.

Referring to FIG. 1, an electricity metering device, generally referred to as 30, is formed of a molded plastic unit including a generally cylindrical base 32 from which extends a generally rectangular terminal housing 34. A cover 36 is securely fastened over the cavity 35 in the terminal housing 34 to protect the enclosed terminals and components from the elements and to prevent tampering.

In the preferred embodiment, the electricity metering device 30 may include circuitry and/or other components for performing metering and/or monitoring functions in addition to those performed by the primary meter 40. This electricity metering device 30, also referred to as an interbase, is mounted to the electrical power lines to be metered at the power box 42. The interbase 30 preferably includes a generally cylindrical base 32 of a diameter suitable to fit into the circular opening 44 at the power box 42.

A plurality of male terminals 46 extend from the bottom of the base 32 and mate with the current jaws 48 at the power box 42 when installed. The upper portion 50 on the base 32 is also preferably cylindrical, and has a diameter suitable to receive the primary meter 40. The meter 40 is installed on the interbase 30 by connecting (or "plugging in") the male terminals 52 extending from the primary meter 40 to corresponding current jaws 54 mounted within the upper portion 50 of the base 32. Conventional adjustable metal rings 56 and 58 typically secure the primary meter 40 in place on the interbase 30 and the interbase to the power box 42 after installation. Once attached, sealing mechanisms (not shown) are used to prevent removal of the rings 56 and 58, as well known in the industry.

Thus, the interbase 30 provides a tamper and weather-resistant enclosure which may be used in conjunction with standard electricity meters, thereby adding metering and monitoring functions, and remote cable access, with minimal installation and replacement time and expense.

Referring to FIG. 2, additional circuitry for performing desired functions (typically in the form of a conventional circuit board 60 (indicated by phantom lines in FIG. 2) may be mounted on the mounting posts 62 within the upper portion 50 of the interbase 30 by the use of conventional fasteners, such as screws. The circuit board may then be connected to the primary meter 40 or other remote connection outside the interbase 30 by routing wires through wire passage 64, and connecting the wires to terminals 66 (shown in FIG. 5), which terminals are then connected to the primary meter 40 or other remote device by cables entering the interbase 30 through the terminal housing 34 or the entry port 68 as required. Additional components such as electrical fuses (shown in phantom lines 70) may be mounted on mounting brackets 72 within the terminal housing 34.

Referring to FIGS. 2-4, the interbase 30 is preferably formed of a commercially available impact-resistant polycarbonate plastic or other electrically insulating material. The base 32 and terminal housing 34 are preferably integral, with the terminal housing 34 located at the periphery of the circular base 32 and having a generally rectangular shape. The terminal housing 34 preferably includes a pair of hinge slots 80,82 located at one side and a recess or socket 84 adapted to accommodate a sealing screw on the opposite side thereof. The terminal housing also preferably includes mounting brackets 72 for mounting electrical components such as fuse 70 (indicated by phantom lines in FIG. 2), and a plurality of wire terminals 66 (see FIGS. 5 and 20, discussed later). The back or rear panel 88 of the housing 34 preferably includes one or more vent openings 90 to promote air circulation. An integral cable retainer 92 is formed on the side wall 94 in alignment with the cable entry slot 96 located at the top edge of the side wall of the terminal housing 34.

In one embodiment of the present invention, the interbase 30 includes circuitry board 60 mounted on the mounting lugs 62 for calculating a secondary rate for electricity usage monitored by the primary meter 40 and the interbase 30. When configured as a secondary rate meter, the interbase also includes a temperature sensor 98 (shown as phantom lines in FIG. 6) mounted on the inside of the cover 36. The ambient temperature sensed by the temperature sensor 98 is monitored by the secondary rate circuitry board 60 and, when the ambient temperature goes above or below predefined thresholds, the secondary rate is calculated for all electricity usage under those predefined conditions.

In another embodiment, circuitry which allows for communication of the data recorded by the primary meter 40 to a remote location may be mounted on board 60. This communication circuitry then may be interconnected via the terminals 66 through a telephone line entering the interbase 30 through the cable entry slot 96 or the entry port 68, thereby allowing for monitoring of electricity usage from a remote location.

Figure 16:
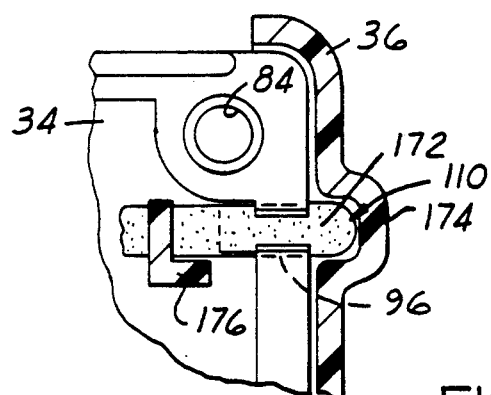
FIG. 16 is a partial cross-sectional view taken in the direction of arrows 16—16 of the terminal housing, cover and cable trap mechanism as shown in FIG. 14.

As shown in FIG. 3, the side wall 94 of the terminal housing 34 may include a "knock-out" entry port 68 for accommodation of electrical and other cables during installation of the interbase 30. If needed or utilized, the central disc is cut out of the port in a conventional manner providing the requisite cable opening or port 68. A conventional elbow connector 102 (shown in phantom lines in FIG. 7) is typically used to protect and guide the entry of the cables into the housing. If the port is not utilized, the disc is left in place providing security for the contents of the housing 34. A similar entry port 104 (see FIGS. 6 and 8) for the same function and purpose is preferably provided on the end wall of the housing 34 opposite port 68. It should be noted that in many applications, the entry ports 68 and 104 can be eliminated or not utilized, since all of the necessary cables may enter the terminal housing 34 via the cable trap 110 (see FIGS. 14-16).

Referring now to FIGS. 5-7, the cover 36, also preferably made of impact-resistant molded plastic, includes one or more hinge pins 120,122 of a size suitable to be inserted into corresponding hinge slots 80,82. The cover 36 is adapted to swing from an open position to a closed position enclosing the inner cavity of the terminal housing 34. A hole 124 is provided on the cover 36 adjacent the socket 84 of housing 34. The hole 124 has a suitable diameter to accommodate a sealing screw 126 so that when the cover 36 is closed, the sealing screw 126 may be inserted into the socket 84 and fastened to a hexagonal nut 128 (FIGS. 12-13), thereby sealing the central cavity in the terminal housing 34.

A first barrier 130 is preferably included on the top edge of the cover 36 above the hinge pins 120 and 122. When the cover 36 is in the closed position, the first barrier 130 is rotated into position immediately opposite a second barrier 132 which extends outwardly on the terminal housing 34 above the hinge slot 80. The barriers 130 and 132 prevent disengagement of hinge pins 120,122 from the hinge slots 80,82 and thus removal of the cover 36 when the cover is in its closed position. The adjacent, opposed positioning of the barriers 130 and 132 also prevent removal of the cover when it is positioned at an opening angle less than approximately 90 degrees from the back panel 88 of the terminal housing 34. The hinge pins 120,122 preferably extend from the shoulder portions 134,136 on the cover 36. The mating relationship of the hinge pins in the hinge slots prevent movement of the cover 36 in the direction opposite the second barrier 132.

It should be noted that when the cover 36 is rotated into an open position greater than approximately 90 degrees from the back panel 88 of the terminal housing 34, the second barrier 132 does not overlap or interfere with the first barrier 130, and the cover 36 may be removed from the terminal housing 34 by pulling the hinge pins 120,122 upwardly out of the hinge slots 80,82. This is illustrated by FIG. 5.

The cover 36 also preferably includes brackets 140, 142, 144 and 146 which extend inward from the cover and are suitably spaced to receive a cylindrically-shaped component, such as temperature sensor 98.

The hinge slots 80,82 are preferably identical and formed in the terminal housing 34 in two adjacent sections. FIGS. 9 and 10 illustrate this with reference to slot 82. One section 134 above hinge slot 82 is slotted to allow movement of the hinge pin 122 in only one direction (indicated by an arrow in FIG. 9) within the slot. The adjacent section 136 of the hinge slot 82 (FIG. 10) is formed with the slot opening at a different location, preferably transverse to the opening of the first section, thereby restricting movement in every direction except as indicated by the arrow. Thus, the first section 134 and second section 136 in combination restrict any movement of the hinge pin 122 in any direction other than parallel to the longitudinal axis of the hinge pin 122. By forming the hinge slots 80,82 in adjacent slotted sections, conventional molding techniques may be utilized to create the hinged slots 80,82 without creating an opening in the bottom of the hinge slots 80,82. By providing closed-end hinge slots 80,82, possible tampering with the cover is minimized.

When the cover 36 is in a closed position, the hinge pins 120,122 within the hinge slots 80,82, the opposed, adjacent barriers 130 and 132, and the sealing screw 126, secure the cover 36 in place over the open cavity 35 of the terminal housing 34.

Figure 11:
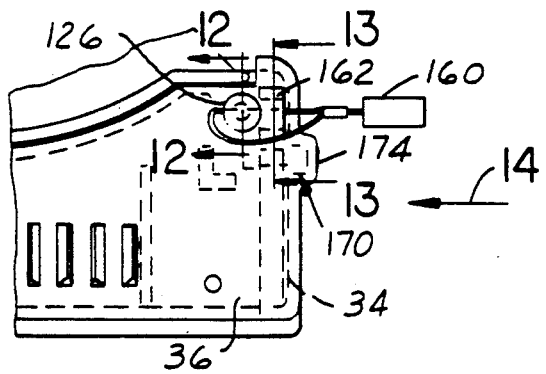
FIG. 11 is a partial front view of the terminal housing with the cover in the closed position illustrating the securing and sealing means.
Figure 12:
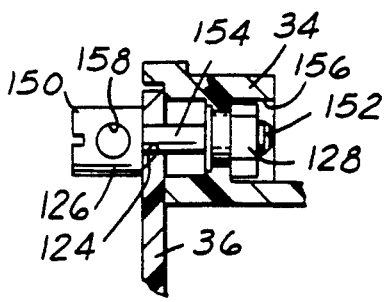
FIG. 12 is a partial cross-sectional view in the direction of arrows 12—12 of the securing and sealing means shown in FIG. 11.
Figure 13:
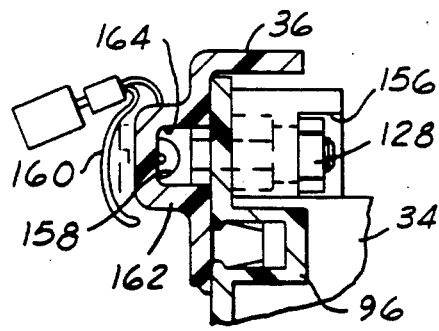
FIG. 13 is a partial cross-sectional view taken in the direction of arrows 13—13 of the securing and sealing means shown in FIG. 11.

Referring now to FIGS. 11-13, the sealing screw 126 preferably includes a head 150, a threaded end portion 152 and a reduced diameter unthreaded intermediate portion 154. Once the sealing screw 126 is threaded through opening 124 on the cover 36, the screw 126 may slide relative to the cover 36 over the length of the unthreaded intermediate portion 154, thereby allowing the cover 36 to swing into contact with the terminal housing 34 before engagement of the sealing screw 126.

The terminal housing 34 preferably includes a socket or pocket 156 for placement of a conventional nut hexagonal shaped to accept a hexagonal nut. This nests the nut 128 within the pocket 156 and prevents the nut from rotating when the screw 126 is threaded into or out of the nut. It is understood, of course, that the nut and pocket can be of any shape, so long as they mate or nest together in the same manner. Also, as shown in FIG. 12, the nut 128 is preferably staked within the nut pocket 156 in order to prevent removal of the nut in the axial direction of the sealing screw 126.

The head 150 of the sealing screw 126 includes a cross-drilled hole 158 suitable for passing a sealing wire 160 therethrough. A lug 162 is formed on the cover 36 immediately adjacent the hole 124. The lug 162 is preferably shaped to allow minimal clearance between it and the head of the sealing screw 126. The lug 162 has an opening 164 formed in it, also suitable for passing screw 126 is engaged, it can tightly secure the cover 36 to the terminal housing 34 and, when hole 158 is aligned with the opening 164 in the lug 162, a sealing wire 160 can be passed through them, preventing unauthorized removal of the cover 36.

Referring now to FIGS. 11, 14, 15 and 16, the present invention also includes a cable trap, generally indicated at 110. The trap 110 allows an electrical cable 172 to enter the terminal housing 34, and prevents removal of the cable when the terminal housing 34 is sealed. The cable trap 110 restrains or "traps" the cable 172 in place, restricting it from being pulled out of the terminal housing 34.

The cable trap 110 includes a cable entry slot 96 formed in the side wall 94 of the terminal housing 34. The slot 96 opens at the top edge of the side wall 94 on the surface covered by the cover 36.

The cover 36 includes a first retainer 174 which, when the cover 36 is closed over the cavity of the terminal housing 34, extends outwardly over the top of the slot 96 and downwardly over the side wall, thereby covering the slot 96 at its side wall opening. The cover 36 also includes a second retainer 176 molded on the under portion of the cover 36 adjacent the slot 96. The first retainer 174 and second retainer 176 are positioned sufficiently close to the side wall of the terminal housing 34 so that, when the cover 36 is closed, the cable entry slot 96, first retainer 174 and second retainer 176 define a U-shaped passage for the creates a circuitous path urging the cable 172 into a small radius bend as it enters the terminal housing 34. This traps the cable 172 in relatively rigid fashion at the entry point into the housing 34, thereby preventing the cable 172 from being pulled out of the terminal housing 34.

The passage formed by the retainers 174 and 176 is preferably only slightly larger than the cable 172. This allows placement of the cable 172 but reduces the likelihood of tampering by attempts to pass other wires or instruments through the cable opening.

Figure 14:
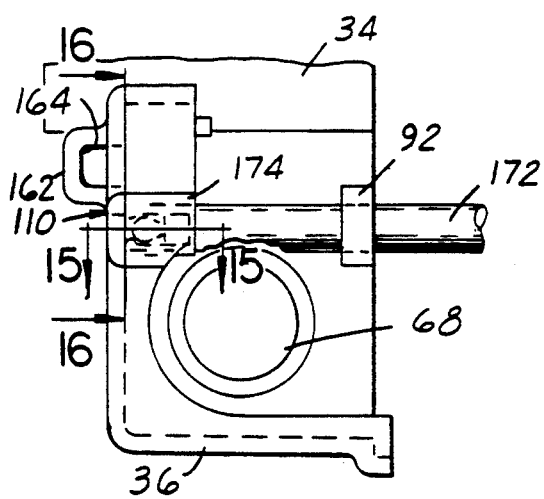
FIG. 14 is a partial side view of the electricity metering device.
Figure 15:
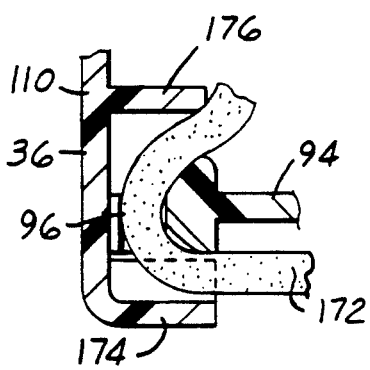
FIG. 15 is a partial cross-sectional view taken in the direction of arrows 15—15 of the terminal housing, cover and cable trap mechanism shown in FIG. 14.
Figure 17:
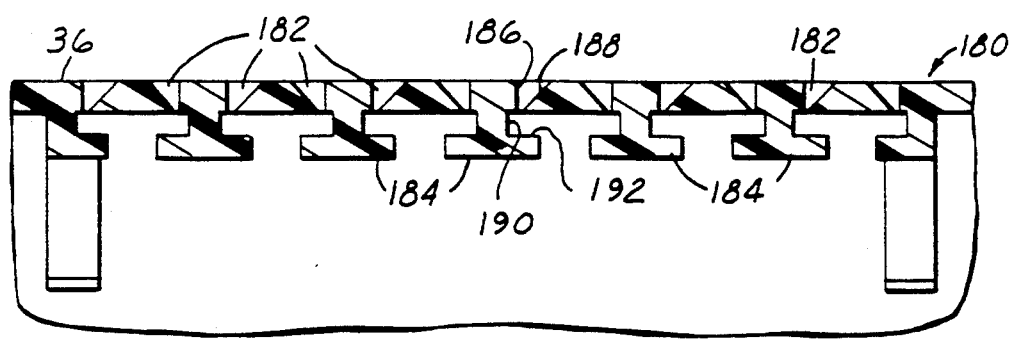
FIG. 17 is a partial cross-sectional view taken in the direction of arrows 17—17 in FIG. 5 illustrating the cover and air vent structure.

A cable retainer clip 92 is positioned on the side wall 94 of the housing 34 (FIG. 14). Once the cable 172 is connected within the terminal housing 34, mounted in the cable entry slot 96, and trapped within the cable trap 110 upon closure and sealing of the cover 36, the cable 172 is secured within the cable retainer 92.

Referring now to FIGS. 5-7, 17 and 19, the cover 36 includes tamper and weather-resistant air circulation and vent mechanism 180. The vent mechanism 180 includes a plurality of vent openings 182 through the cover 36 and a plurality of vent shields 184 projecting from the inner surface of the cover 36. The vent openings 182 include a first side wall 186 which is generally perpendicular to the surface of the cover 36 and the second side wall 188 which is angled relative to the surface of the cover 36 in such a manner that an object inserted in the vent opening 182 would be urged toward the first side wall 184 and at an angle through the vent opening 182.

The vent shields 184 include first walls 190 and second walls 192. The first walls extend generally perpendicularly from the inside surface of the cover 36 immediately adjacent the vent openings 182. The second walls 192 extending generally perpendicular from the first walls 190 and generally parallel to the surface of the cover 36 and extend over the vent openings 182.

The vent shields 184 extend over and cover the entire length of the vent openings 182. While allowing air to circulate between the inside and outside of the terminal housing 34, the first walls 190 and second walls 192 define trapping pockets which inhibit penetration of any object inserted into the vent openings 182. The vent openings 182 are preferably arranged in a parallel series on the cover 36 with the first side walls 186 and second side walls 188 of each vent opening, and in alternating arrangement with each adjacent vent opening. This allows the vent shields 184 to be configured in a "T" cross-section between pairs of vent openings 182, thereby creating a pair of trapping pockets With each vent shield 184, one trapping pocket for each of two adjacent vent openings 182 on either side of the vent shields 184.

Figure 19:
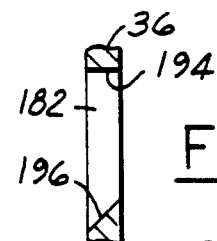
FIG. 19 is a partial cross-sectional view taken in the direction of arrows 19—19 of FIG. 7 illustrating the configuration of the cover vent openings.

Referring now to FIG. 19, the top wall 194 of each of the vent openings 182 is preferably perpendicular to the surface of the cover and the bottom wall 196 is preferably angled. The bottom wall 196 slopes downward from the inside surface of the cover 36 towards the outer surface of the cover 36 minimizing rain penetration into the interior cavity of the housing 34.

Figure 18:
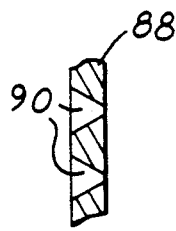
FIG. 18 is a partial cross-sectional view of FIG. 4 taken in the direction of arrows 18—18 showing the back panel of the terminal housing and the rear vent openings.

Referring to FIGS. 4 and 18, a plurality of air vents 90 are preferably located on the back wall 88 of the terminal housing 34. These air vents allow for additional circulation of ambient air into the sealed interbase 30.

Figure 20:
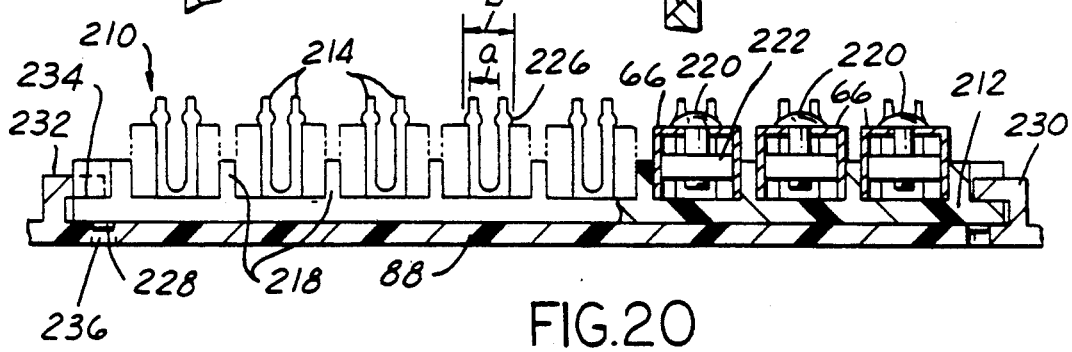
FIG. 20 is a partial cross-sectional view taken in the direction of arrows 20—20 in FIG. 5 showing the terminal housing and snap-on mounts for the wire terminals.

Referring now to FIGS. 5 and 20, a snap-on terminal mount, generally referred to as 210, includes a generally planar base 212 from which a plurality of resilient retainer arms 214 extend to accept and retain wire terminals 66. The base 212 preferably includes a plurality of spacers 218 which aid in positioning the terminals 66 upon installation and maintaining separation of the terminals 66 to prevent electrical contact therebetween.

As can be seen, the terminals are of conventional design consisting of a bent metal body portion having a top planar surface and two side walls. The top surface of the terminal 66 includes a hole suitable to accommodate a conventional screw or bolt 220. A nut 222 is positioned between the side walls of the terminal 66 and is connected to the bolt. The nut is preferably a square nut of a dimension roughly equal to the distance between the side walls and the terminal so that the nut cannot rotate within the terminal, thereby allowing for loosening or tightening of the nut and bolt by rotating the screw or bolt. The end of the bolt is also staked or deformed in some manner in order to prevent the bolt from being completely removed from the nut. This allows for quick connect and disconnect of wires.

The terminal 66 also includes a rectangular opening 224 on the top surface that is equal in width to the distance "a" between the outer sides of the mounting arms 214 of the terminal mount 210, but less than the distance "b" between the shoulders 226 on the mounting arms 214.

The mounting arms 214 are arranged in pairs on the terminal mount 210. Each of the mounting arms 214 includes a shoulder portion 226 which extends outwardly and, upon installation of the terminals 66, snap over the top surface of the terminal, thereby securing the terminal in place on the base. The base 212 also preferably includes one or more lugs 228 which extend downwardly from the bottom surface of the base.

The back or rear panel 88 of the terminal housing 34 preferably includes a pair of inwardly extending mounting plates 230,232. The plates 230,232 define a cavity within which the end portions 234 of the base 212 of the terminal mount 210 may be slidably positioned upon installation of the mount 210 in the terminal housing 34. The base also includes at least one hole positioned to accommodate the lug 228 so that when the base 212 is slidably positioned underneath the mounting plates 230,232, the lug snaps into the hole 236, thereby securing the base in position.

It will be appreciated by those skilled in the art that the terminal mount 210 of the present invention provides an integral mounting structure which may be quickly mounted within the terminal housing 34 without the use of additional fasteners, and which allows for secure, snap-on mounting of a plurality of wire terminals, again without the use of additional fasteners.

While the best mode for carrying out the invention has been described in detail, those familiar with the art to which this invention relates will recognize various alternative designs and embodiments for practicing the invention as defined by the following claims.

What is claimed is:

1. A securing mechanism for an electricity metering device including a housing having a cavity, the securing mechanism comprising:
   a cover connected to the housing with hinge means;
   a first opening on the cover;
   a lug on the cover adjacent the first opening, the lug defining a second opening; and
   a sealing screw including a head having a cross-drilled hole, whereby the sealing screw is inserted into the first opening in the cover, screwed into the housing, and rotated until the cover is secured over the housing and the cross-drilled hole is aligned with the second opening on the lug, whereby a sealing wire is passed through the second opening and the cross-drilled hole in the sealing screw.

2. The sealing mechanism of claim 1 wherein the sealing screw is secured to the cover and the housing by a nut, and the housing further includes a socket configured to accommodate the nut, the socket shaped in sufficient conformity with the shape of the nut to prevent the nut from rotating in the socket.

3. The sealing mechanism of claim 2 wherein the nut is staked within the socket.

4. The sealing mechanism of claim 1 wherein the sealing screw includes a threaded end portion and a reduced diameter unthreaded intermediate portion, whereby, the sealing screw slides relative to the cover over the length of the unthreaded intermediate portion, thereby allowing the cover to swing into contact with the housing prior to engagement of the sealing screw.

5. The sealing mechanism of claim 1 further comprising:
   a first barrier member on the housing and a second barrier member on the cover adjacent said first barrier member for preventing disassembly of the cover from the housing when the cover is in the closed position covering the cavity of the housing.

6. A securing mechanism for an electricity metering device including a housing having a cavity, the securing mechanism comprising:
   a cover connected to the housing with hinge means;
   a first opening on the cover;
   a lug on the cover adjacent the first opening, the lug defining a second opening; and
   a sealing screw including a head having a cross-drilled hole, a threaded end portion, and a reduced diameter unthreaded intermediate portion, whereby the sealing screw is inserted into the first opening on the cover and slides relative to the cover over the length of the unthreaded intermediate portion, thereby allowing the cover to swing into contact with the housing prior to engagement of the sealing screw, and whereby the sealing screw is screwed into the housing, and rotated until the cover is secured over the housing and a cross-drilled hole is aligned with the second opening on the cover, and whereby a sealing wire is passed through the second opening and the cross-drilled hole in the sealing screw.

7. A sealing mechanism of claim 6, wherein a sealing screw is secured to the cover on the housing by a nut, and the housing further includes a socket configured to accommodate the nut, the socket shaped in sufficient conformity with the shape of the nut to prevent the nut from rotating in the socket.

8. The sealing mechanism of claim 6 wherein the nut is staked within the socket.

9. The sealing mechanism of claim 6 further comprising:
   a first barrier member on the housing and a second barrier member on the cover adjacent the first barrier member for preventing disassembly of the cover from the housing when the cover is in the closed position covering the cavity of the housing.

* * * * *